(12) United States Patent
Hamaguchi

(10) Patent No.: US 6,639,963 B2
(45) Date of Patent: Oct. 28, 2003

(54) UP/DOWN GRAY CODE COUNTER AND SOLID-STATE IMAGE SENSOR PROVIDED WITH SUCH A COUNTER

(75) Inventor: Mutsumi Hamaguchi, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/005,082

(22) Filed: Dec. 7, 2001

(65) Prior Publication Data

US 2003/0108142 A1 Jun. 12, 2003

(30) Foreign Application Priority Data

Dec. 7, 2000 (JP) .................................... 2000-372319

(51) Int. Cl.$^7$ .............................................. H03K 21/00
(52) U.S. Cl. ........................... 377/34; 377/45; 377/114; 250/208.1; 250/234; 250/235
(58) Field of Search .......................... 250/208.1, 234–5; 377/34, 45, 114

(56) References Cited

U.S. PATENT DOCUMENTS 4,937,845 A  6/1990  Warner .......................... 377/34
5,191,425 A * 3/1993 Hachiyama et al. ... 358/213.15

FOREIGN PATENT DOCUMENTS

| DE | 69130780 T2 | 6/1999 |
| EP | 0459248 A1 | 12/1991 |
| EP | 0691744 A1 | 1/1996 |
| JP | A1-251822 | 10/1989 |
| JP | 02261275 A | 10/1990 |

* cited by examiner

Primary Examiner—Margaret R. Wambach
(74) Attorney, Agent, or Firm—Birch, Stewart, Kolasch & Birch, LLP

(57) ABSTRACT

A conventional up/down Gray code counter has both a logic circuit section for up counting and a logic circuit section for down counting, and thus has a large circuit scale. To overcome this inconvenience, an up/down Gray code counter of the invention has a one-way Gray code counter that can count only in one, up or down, direction and a highest bit selecting circuit that receives the highest bit of the data output from the one-way Gray code counter and that then outputs the bit selectively either intact or after inverting it.

16 Claims, 12 Drawing Sheets

PRIOR ART
Fig. 3

| DECIMAL COUNT | BINARY CODE | GRAY CODE |
|---|---|---|
| 0 | 00000 | 00000 |
| 1 | 00001 | 00001 |
| 2 | 00010 | 00011 |
| 3 | 00011 | 00010 |
| 4 | 00100 | 00110 |
| 5 | 00101 | 00111 |
| 6 | 00110 | 00101 |
| 7 | 00111 | 00100 |
| 8 | 01000 | 01100 |
| 9 | 01001 | 01101 |
| 10 | 01010 | 01111 |
| 11 | 01011 | 01110 |
| 12 | 01100 | 01010 |
| 13 | 01101 | 01011 |
| 14 | 01110 | 01001 |
| 15 | 01111 | 01000 |
| 16 | 10000 | 11000 |
| 17 | 10001 | 11001 |
| 18 | 10010 | 11011 |
| 19 | 10011 | 11010 |
| 20 | 10100 | 11110 |
| 21 | 10101 | 11111 |
| 22 | 10110 | 11101 |
| 23 | 10111 | 11100 |
| 24 | 11000 | 10100 |
| 25 | 11001 | 10101 |
| 26 | 11010 | 10111 |
| 27 | 11011 | 10110 |
| 28 | 11100 | 10010 |
| 29 | 11101 | 10011 |
| 30 | 11110 | 10001 |
| 31 | 11111 | 10000 |

Fig. 4

| HIGHEST BIT INTACT | | HIGHEST BIT INVERTED | |
|---|---|---|---|
| DECIMAL COUNT | GRAY CODE | DECIMAL COUNT | GRAY CODE |
| 0 | 00000 | 31 | 10000 |
| 1 | 00001 | 30 | 10001 |
| 2 | 00011 | 29 | 10011 |
| 3 | 00010 | 28 | 10010 |
| 4 | 00110 | 27 | 10110 |
| 5 | 00111 | 26 | 10111 |
| 6 | 00101 | 25 | 10101 |
| 7 | 00100 | 24 | 10100 |
| 8 | 01100 | 23 | 11100 |
| 9 | 01101 | 22 | 11101 |
| 10 | 01111 | 21 | 11111 |
| 11 | 01110 | 20 | 11110 |
| 12 | 01010 | 19 | 11010 |
| 13 | 01011 | 18 | 11011 |
| 14 | 01001 | 17 | 11001 |
| 15 | 01000 | 16 | 11000 |
| 16 | 11000 | 15 | 01000 |
| 17 | 11001 | 14 | 01001 |
| 18 | 11011 | 13 | 01011 |
| 19 | 11010 | 12 | 01010 |
| 20 | 11110 | 11 | 01110 |
| 21 | 11111 | 10 | 01111 |
| 22 | 11101 | 9 | 01101 |
| 23 | 11100 | 8 | 01100 |
| 24 | 10100 | 7 | 00100 |
| 25 | 10101 | 6 | 00101 |
| 26 | 10111 | 5 | 00111 |
| 27 | 10110 | 4 | 00110 |
| 28 | 10010 | 3 | 00010 |
| 29 | 10011 | 2 | 00011 |
| 30 | 10001 | 1 | 00001 |
| 31 | 10000 | 0 | 00000 |

UP/DOWN GRAY CODE COUNTER AND SOLID-STATE IMAGE SENSOR PROVIDED WITH SUCH A COUNTER

BACKGROUND OF THE INVENTION

1. Field of the Invention

The present invention relates to a Gray code counter, and relates particularly to an up/down Gray code counter that can count both up and down.

2. Description of the Prior Art

Conventional counters are binary code counters that use a binary code as shown in FIG. 3. In FIG. 3 is shown a binary code of which each codeword consists of five bits. In a binary code counter, when the count as represented in decimal notation increases by one, a plurality of bits may change simultaneously. For example, when the count in decimal notation changes from "0" to "1," the binary codeword changes from "00000" to "00001," and thus only one bit changes; by contrast, when the count in decimal notation changes from "15" to "16," the binary codeword changes from "01111" to "10000," and thus five bits change simultaneously. The larger the number of bits that change simultaneously, the more the electric current consumed to achieve the change, and this produces electric noise. Such electric noise may lead to interference among the signals within the counter, and thus to malfunctioning of the whole system.

As a counter with reduced electric noise resulting from simultaneous change of a plurality of bits as described above, Gray code counters that use a Gray code as shown in FIG. 3 have been proposed. In FIG. 3 is shown a Gray code of which each codeword consists of five bits. In a Gray code, two consecutive counts in decimal notation differ only in one bit and are identical in the other bits. That is, between any two consecutive counts in decimal notation, only one bit changes. As a result, a Gray code counter requires less electric current to achieve bit change than a binary code counter, and thus can reduce electric noise resulting from simultaneous change of a plurality of bits.

On the other hand, some solid-state image sensors employ a decoder-type scanning circuit. A decoder-type scanning circuit scans the address that coincides with the value output from a counter. In a solid-state image sensor, scanning from the address having the smallest value upward results in a normal image mode, and scanning from the address having the greatest value downward results in a mirror image mode. Therefore, to operate a solid-state image sensor both in a normal image mode and in a mirror image mode, it is necessary to use a counter that can count both up and down.

A typical example of the logic circuit used in a conventional up/down Gray code counter that operates with reduced electric noise and that can count both up and down is shown in FIG. 6. In FIG. 6 is shown a conventional up/down Gray code counter of a five-bit type. The conventional up/down Gray code counter 10 is provided with an up count clock generating circuit 11 and a down count clock generating circuit 12. According to a command signal MIR, a clock switching circuit 13 chooses between the signal output from the up count clock generating circuit 11 or the signal output from the down count clock generating circuit 12, and feeds the chosen signal to flip-flops FF11 to FF15. Specifically, the clock switching circuit 13 outputs, for up counting, the signal from the up count clock generating circuit 11 and, for down counting, the signal from the down count clock generating circuit 12.

Examples of up/down Gray code counters provided with a logic circuit section for up counting and a logic circuit section for down counting include not only the up/down Gray code counter shown in FIG. 6 but also the up/down Gray code counter disclosed in Japanese Patent Application Laid-Open No. H1-251822.

The conventional up/down Gray code counter described above is provided with both a logic circuit section for up counting and a logic circuit section for down counting. Disadvantageously, this configuration requires additional provision of a logic circuit section that operates in down counting, which is not found in a Gray code counter that only counts up, a and thus requires a larger circuit scale.

SUMMARY OF THE INVENTION

An object of the present invention is to provide an up/down Gray code counter with a smaller circuit scale. Another object of the present invention is to provide a solid-state image sensor that is switchable between a normal image mode and a mirror image mode but that is nevertheless ready to be miniaturized.

To achieve the above objects, according to one aspect of the present invention, an up/down Gray code counter is provided with a one-way Gray code counter that can count only in one, up or down, direction and a highest bit selecting circuit that receives the highest bit of the data output from the one-way Gray code counter and that then outputs the bit selectively either intact or after inverting it.

According to another aspect of the present invention, a solid-state image sensor is provided with a plurality of photoelectric conversion elements and a scanning circuit including an up/down Gray code counter for sequentially reading signals from the photoelectric conversion elements. Here, the up/down Gray code counter is provided with a one-way Gray code counter that can count only in one, up or down, direction and a highest bit selecting circuit that receives the highest bit of the data output from the one-way Gray code counter and that then outputs the bit selectively either intact or after inverting it.

BRIEF DESCRIPTION OF THE DRAWINGS

This and other objects and features of the present invention will become clear from the following description, taken in conjunction with the preferred embodiments with reference to the accompanying drawings in which:

FIG. 3 is a diagram showing the codewords of a binary code and of a Gray code corresponding to counts in decimal notation;

FIG. 4 is a diagram showing counts in decimal notation and the corresponding codewords of a Gray code with the highest bit inverted;

DESCRIPTION OF THE PREFERRED EMBODIMENTS

Figure 1:
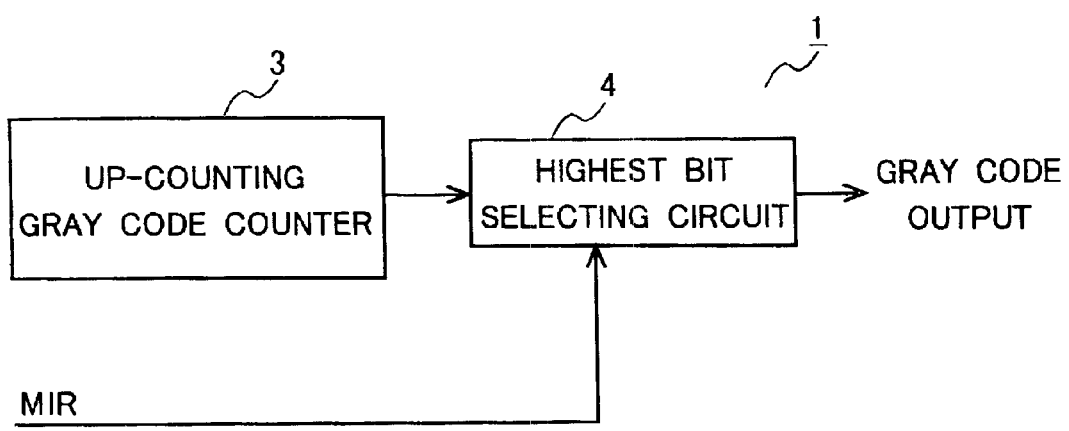
FIG. 1 is a configuration diagram of the up/down Gray code counter of a first embodiment of the invention.

As a result of intensive research on how the circuit scale of an up/down Gray code counter can be reduced, the inventors of the present invention have found out that it is possible to reduce the circuit scale of an up/down Gray code counter by exploiting the symmetry in the arrangement of the bits other than the highest bit constituting the codewords of a Gray code. Here, the symmetry in the arrangement of the bits other than the highest bit constituting the codewords of a Gray code denotes the following fact. In the five-bit Gray code shown in FIG. 3, the codewords corresponding to the counts "15" and "16" in decimal notation have the same bit arrangement except for the highest bit. The same is true also with the counts "14" and "17" in decimal notation, the counts "13" and "18" in decimal notation, the counts "12" and "19" in decimal notation, . . . , the counts "1" and "30" in decimal notation, and the counts "0" and "31" in decimal notation. That is, any two codewords that are located symmetrically about the mid value between the counts "15" and "16" in decimal notation have the same bit arrangement in the lowest four bits, i.e. except for the highest bit. Here, where a five-bit counter is dealt with, the mid value between the counts "15" and "16" in decimal notation is the center of symmetry. In general, with an N-bit counter, the mid value between the counts "$2^{N-1}-1$" and "$2^{N-1}$" is the center of symmetry.

The correspondence between counts in decimal notation and the codewords of the Gray code shown in FIG. 3 as observed when the highest bit is inverted is shown in FIG. 4. The count "0" in decimal notation corresponds to the codeword "00000" of the Gray code, which, when the highest bit is inverted, becomes "10000." This codeword "10000" of the Gray code corresponds to the count "31" in decimal notation. Thus, when output with the highest bit inverted, the count "0" in decimal notation becomes "31," the count "1" in decimal notation becomes "30," the count "2" in decimal notation becomes "29," . . . , the count "30" in decimal notation becomes "1," and the count "31" in decimal notation becomes "0."

When the sequence of counts obtained by counting up from "0" to "31" in decimal notation is output with the highest bit inverted, the resulting sequence of counts is the same as that obtained by counting down from "31" to "0" in decimal notation. That is, by operating a five-bit Gray code counter in such a way that it counts up from "0" to "31" in decimal notation and outputs each count with the highest bit inverted, it is possible to count down from "31" to "0" in decimal notation. In general, by operating an N-bit Gray code counter in such a way that it counts up from "0" to "$2^{N-1}$" in decimal notation and outputs each count with the highest bit inverted, it is possible to count down from "$2^{N-1}$" to "0" in decimal notation.

Hereinafter, up/down Gray code counters embodying the invention which exploit the aforementioned symmetry in the arrangement of the bits other than the highest bit constituting the codewords of a Gray code will be described with reference to the drawings.

The configuration of the up/down Gray code counter of a first embodiment of the invention is shown in FIG. 1. The up/down Gray code counter 1 of the first embodiment is composed of an up-counting Gray code counter 3 and a highest bit selecting circuit 4. The up-counting Gray code counter 3 counts up, and feeds the count in the form of a Gray code to the highest bit selecting circuit 4.

If it is assumed that the up-counting Gray code counter 3 is of an N-bit type, the signal fed from the up-counting Gray code counter 3 to the highest bit selecting circuit 4 is in the form of N-bit data consisting of Q0, Q1, . . . , Q(N−2), and Q(N−1). Here, Q0 is the lowest bit, and the Q(N−1) is the highest bit.

The highest bit selecting circuit 4 also receives a count direction control signal MIR. When the count direction control signal MIR is requesting up counting, the highest bit selecting circuit 4, to which the signal from the up-counting Gray code counter 3 is fed in the form of N-bit data consisting of Q0, Q1, . . . , Q(N−2), and Q(N−1), outputs the data intact. By contrast, when the count direction control signal MIR is requesting down counting, the highest bit selecting circuit 4, to which the signal from the up-counting Gray code counter 3 is fed in the form of N-bit data consisting of Q0, Q1, . . . , Q(N−2), and Q(N−1), inverts the highest bit Q(N−1) to turn it to Q(N−1)X and then outputs N-bit data consisting of Q0, Q1, . . . , Q(N−2), and Q(N−1)X as the output of the up/down Gray code counter 1.

Figure 7:
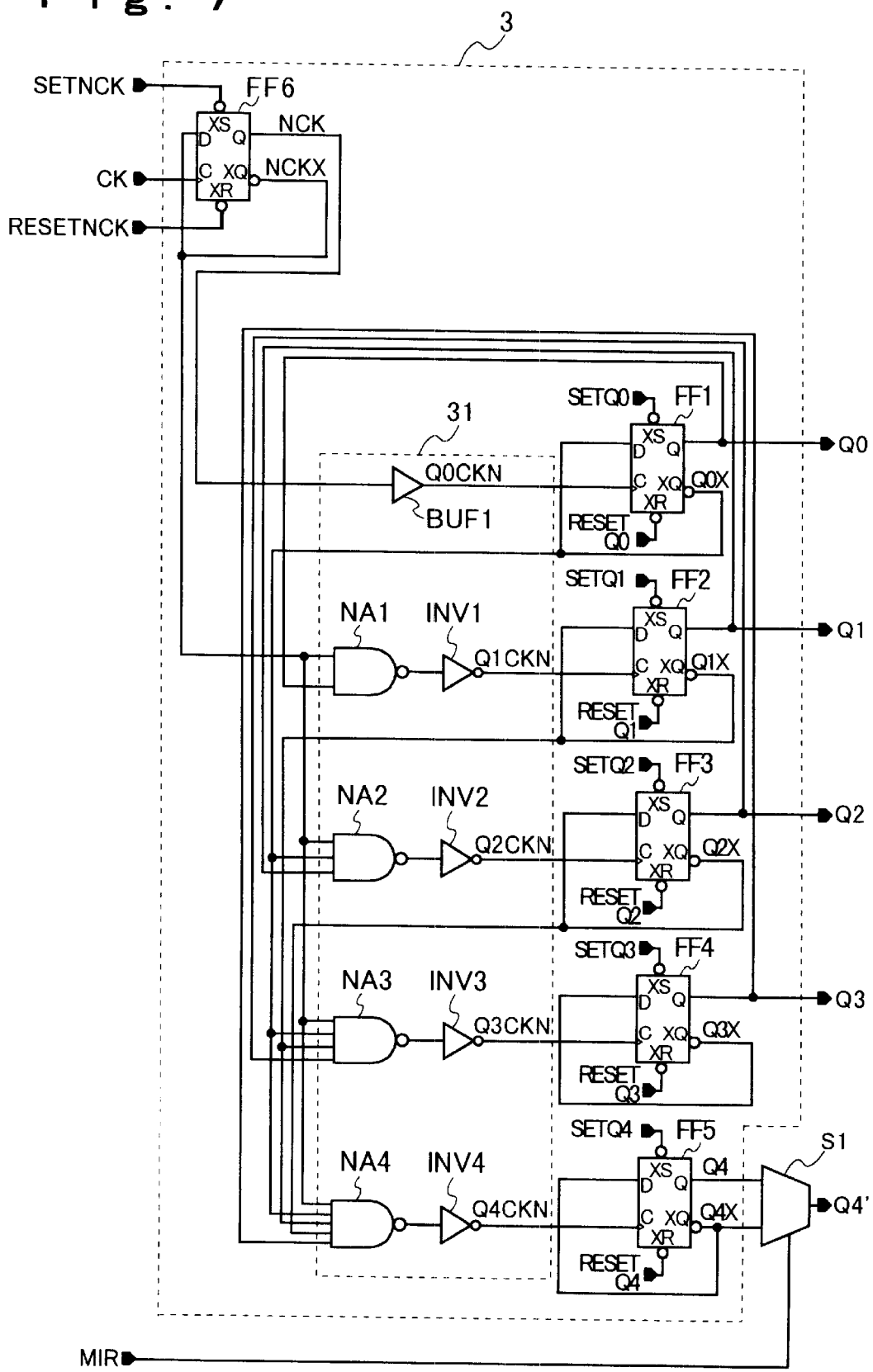
FIG. 7 is a logic circuit diagram of the up/down Gray code counter of FIG. 1.

An example of the logic circuit used in the up/down Gray code counter 1 shown in FIG. 1 is shown in FIG. 7. In FIG. 7 is shown the logic circuit used when the up/down Gray code counter 1 is of five-bit type.

The Q output terminal of a flip-flop FF6 is connected through a buffer BUF1 to the C input terminal of a flip-flop FF1. The XQ output terminal of the flip-flop FF6 is connected to the first input terminal of each of NAND circuits NA1 to NA4.

The second input terminal of the NAND circuit NA1 is connected to the Q output terminal of the flip-flop FF1. The output terminal of the NAND circuit NA1 is connected through an inverter circuit INV1 to the C input terminal of a flip-flop FF2.

The second input terminal of the NAND circuit NA2 is connected to the XQ output terminal of the flip-flop FF1, and the third input terminal of the NAND circuit NA2 is connected to the Q output terminal of the flip-flop FF2. The output terminal of the NAND circuit NA2 is connected through an inverter circuit INV2 to the C input terminal of a flip-flop FF3.

The second input terminal of the NAND circuit NA3 is connected to the XQ output terminal of the flip-flop FF1, the third input terminal of the NAND circuit NA3 is connected to the XQ output terminal of the flip-flop FF2, and the fourth input terminal of the NAND circuit NA3 is connected to the Q output terminal of the flip-flop FF3. The output terminal of the NAND circuit NA3 is connected through an inverter circuit INV3 to the C input terminal of a flip-flop FF4.

The second input terminal of the NAND circuit NA4 is connected to the XQ output terminal of the flip-flop FF1, the third input terminal of the NAND circuit NA4 is connected to the XQ output terminal of the flip-flop FF2, the fourth input terminal of the NAND circuit NA4 is connected to the XQ output terminal of the flip-flop FF3, and the fifth input terminal of the NAND circuit NA4 is connected to the Q output terminal of the flip-flop FF4. The output terminal of the NAND circuit NA4 is connected through an inverter circuit INV4 to the C input terminal of a flip-flop FF5.

Moreover, in each of the flip-flops FF1 to FF6, the XQ output terminal and the D input terminal are connected together. Thus, in each of the flip-flops FF1 to FF6, every time the clock signal fed to their C input terminal rises, the output signal output from their Q a output terminal is inverted.

The Q output terminal of the flip-flop FF5 is connected to a selector S1.

The buffer BUF1, the NAND circuits NA1 to NA4, and the inverter circuits INV1 to INV4 together constitute a clock generating circuit 31, which functions as a circuit that generates clocks that determine the timing with which the individual outputs of the up-counting Gray code counter are inverted. The clock generating circuit 31 and the flip-flops FF1 to FF6 together function as the up-counting Gray code counter 3, and the selector S1 functions as the highest bit selecting circuit 4 shown in FIG. 1.

Figure 6:
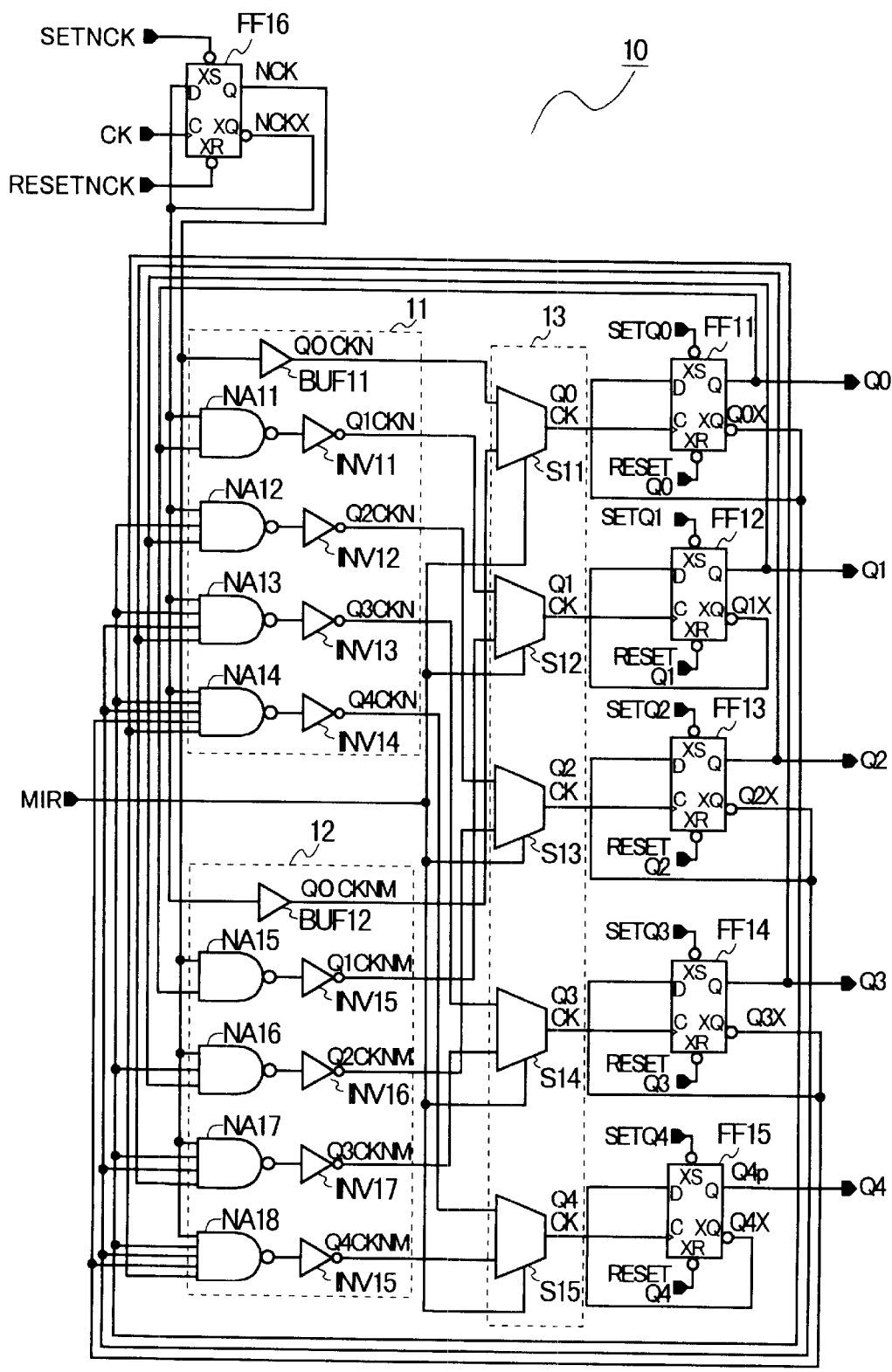
FIG. 6 is a logic circuit diagram of a conventional up/down Gray code counter.
Figure 10:
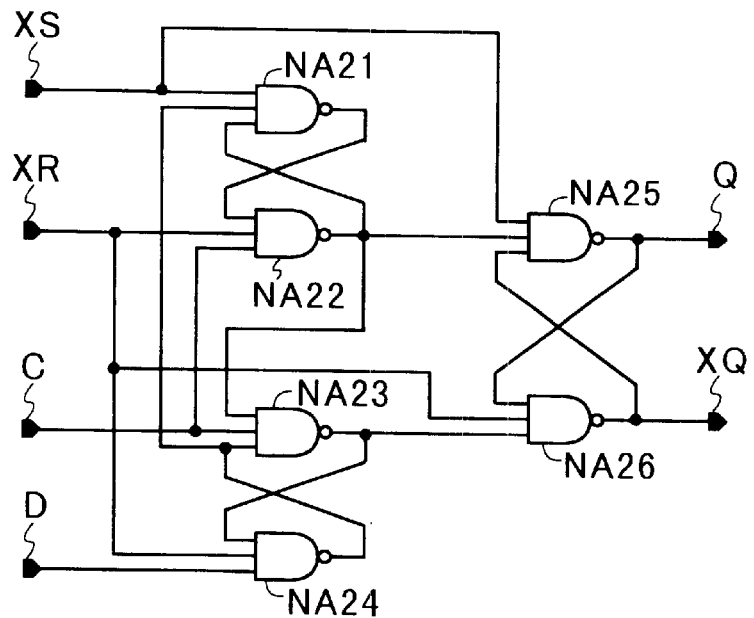
FIG. 10 is a configuration diagram of the flip-flops provided in an up/down Gray code counter embodying the invention.

An example of the configuration of the flip-flops FF1 to FF6, and of the flip-flops FF11 to FF16 shown in FIG. 6, is shown in FIG. 10. Each flip-flop is provided with six NAND circuits each having three input terminals.

The XS terminal of the flip-flop is connected to the first input terminal of a NAND circuit NA21 and to the first input terminal of a NAND circuit NA25. The XR terminal of the flip-flop is connected to the second input terminal of a NAND circuit NA22, to the second input terminal of a NAND circuit NA24, and to the second input terminal of a NAND circuit NA26. The C input terminal of the flip-flop is connected to the third input terminal of the NAND circuit NA22 and to the second input terminal of a NAND circuit NA23. The D input terminal of the flip-flop is connected to the third input terminal of the NAND circuit NA24.

The second input terminal of the NAND circuit NA21 and the third input terminal of the NAND circuit NA23 are connected to the output terminal of the NAND circuit NA24. The node at which the third input terminal of the NAND circuit NA21, the output terminal of the NAND circuit NA22, and the first input terminal of the NAND circuit NA23 are connected together is connected to the second input terminal of the NAND circuit NA25. The output terminal of the NAND circuit NA21 and the first input terminal of the NAND circuit NA22 are connected together. The output terminal of the NAND circuit NA23 and the first input terminal of the NAND circuit NA24 are connected to the third input terminal of the NAND circuit NA26.

The node between the output terminal of the NAND circuit NA25 and the first input terminal of the NAND circuit NA26 serves as the Q output terminal of the flip-flop. The node between the third input terminal of the NAND circuit NA25 and the output terminal of the NAND circuit NA26 serves as the XQ output terminal of the flip-flop.

Next, the operation of the up/down Gray code counter of the first embodiment shown in FIG. 7 will be described with reference to FIGS. 5 and 7. Here, it is assumed that the set signals SETQ0 to SETQ4 and SETNCK fed respectively to the XS terminals of the flip-flops FF1 to FF6 are kept at "1" all the time, and that the reset signals RESETQ0 to RESETQ4 and RESETNCK fed respectively to the XR terminals of the flip-flops FF1 to FF6 are kept at "1" all the time.

The flip-flop FF6 receives a reference clock signal CK, produces a ½ clock signal NCK by dividing the reference clock signal CK by a factor of 2, and feeds the ½ clock signal NCK and the inverted version NCKX thereof to the clock generating circuit 31 in the following stage.

The clock generating circuit 31 produces a clock signal Q0CKN that is identical an with the ½ clock signal NCK. The flip-flop FF1 receives the clock signal Q0CKN from the clock generating circuit 31, and therefore outputs an output signal Q0 that is inverted every time the ½ clock signal NCK rises and the inverted version Q0X of that output signal Q0.

The clock generating circuit 31 also produces a clock signal Q1CKN that rises when the ½ clock signal NCK falls while the output signal Q0 is at "1." The flip-flop FF2 receives the clock signal Q1CKN from the clock generating circuit 31, and therefore outputs an output signal Q1 that is inverted every time the clock signal Q1CKN rises and the inverted version Q1X of that output signal Q1.

The clock generating circuit 31 also produces a clock signal Q2CKN that rises when the ½ clock signal NCK falls while the output signal Q0 is at "0" and the output signal Q1 is at "1." The flip-flop FF3 receives the clock signal Q2CKN from the clock generating circuit 31, and therefore outputs an output signal Q2 that is inverted every time the clock signal Q2CKN rises and the inverted version Q2X of that output signal Q2.

The clock generating circuit 31 also produces a clock signal Q3CKN that rises when the ½ clock signal NCK falls while the output signal Q0 is at "0," the output signal Q1 is at "0," and the output signal Q2 is at "1." The flip-flop FF4 receives the clock signal Q3CKN from the clock generating circuit 31, and therefore outputs an output signal Q3 that is inverted every time the clock signal Q3CKN rises and the inverted version Q3X of that output signal Q3.

The clock generating circuit 31 also produces a clock signal Q4CKN that rises when the ½ clock signal NCK falls while the output signal Q0 is at "0," the output signal Q1 is at "0," the output signal Q2 is at "0," and the output signal Q3 is at "1." The flip-flop FF5 receives the clock signal Q4CKN from the clock generating circuit 31, and therefore outputs an output signal Q4 that is inverted every time the clock signal Q4CKN rises and the inverted version Q4X of that output signal Q4.

If it is assumed that the output signal Q0 is the output for the zeroth bit, i.e. the lowest bit, the output signal Q1 is the output for the first bit, the output signal Q2 is the output for the second bit, the output signal Q3 is the output for the third bit, and the output signal Q4 is the output for the fourth bit, i.e. the highest bit, then the up-counting Gray code counter outputs the Gray code shown in FIG. 3 according to the count, in decimal notation, of the reference clock signal CK.

The selector S1 receives the output signal Q4 from the flip-flop FF5. When the count direction control signal MIR is requesting up counting, the selector S1 outputs the output signal Q4 fed thereto intact as an output signal Q4'. That is, the highest bit is not inverted. Thus, the up/down Gray code counter outputs the Gray code in the version without the inversion of the highest bit shown in FIG. 4. In this way, the up/down Gray code counter is made to count up.

By contrast, when the count direction control signal MIR is requesting down counting, the selector S1 outputs the output signal Q4 fed thereto after inverting it as the output signal Q4'. That is, the highest bit is inverted. Thus, the up/down Gray code counter outputs the Gray code in the version with the inversion of the highest bit shown in FIG. 4. In this way, the up/down Gray code counter is made to count down.

In this way, simply by adding the selector S1 to the up-counting Gray code counter 3, which can only count up, it is possible to make it count both up and down. The up/down Gray code counter of the first embodiment shown in FIG. 7 requires only one clock generating circuit, and thus requires a smaller circuit scale than the conventional up/down Gray code counter shown in FIG. 6, which requires two clock generating circuits. Moreover, in this embodiment, the same degree of reduction of electric noise, which is the distinctive characteristic of an up/down Gray code counter, is achieved as in the conventional up/down Gray code counter.

Figure 11A:
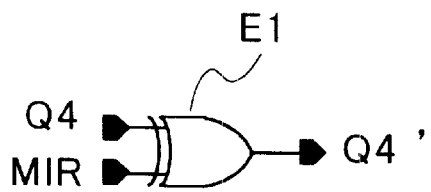
FIG. 11A is a diagram showing an example of the selector shown in FIG. 7.

An example of the configuration of the selector S1 is shown in FIG. 11A. The output Q4 for the highest bit is fed to the first input terminal of an exclusive OR circuit E1, and the count direction control signal MIR is fed to the second input terminal thereof For up counting, the count direction control signal MIR is kept at "0," and, for down counting, the count direction control signal MIR is kept at "1." Thus, the exclusive OR circuit E1 outputs from its output terminal, as the signal Q4', the output signal Q4 in up counting and the inverted version of the output signal Q4 in down counting.

Figure 11B:
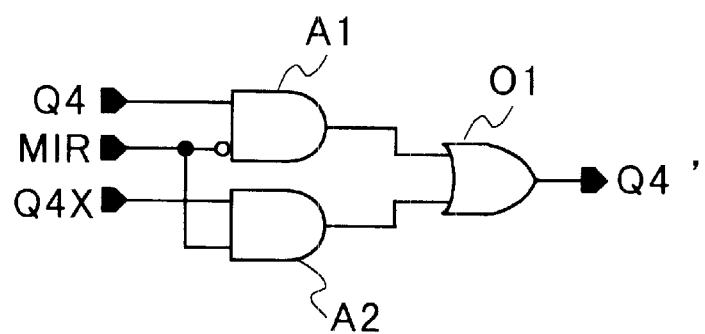
FIG. 11B is a diagram showing another example of the selector shown in FIG. 7.

Another example of the configuration of the selector S1 is shown in FIG. 11B. In this example, not only the Q output terminal of the flip-flop FF5 shown in FIG. 7, but also the XQ output terminal thereof is connected to the selector S1. The output Q4 for the highest bit is fed to the first input terminal of an AND circuit A1, and the count direction control signal MIR is, after being inverted, fed to the second input terminal thereof The inverted version Q4X of the output Q4 for the highest bit is fed to the first input terminal of an AND circuit A2, and the count direction control signal MIR is fed to the second input terminal thereof The output signals of the AND circuits A1 and A2 are fed to an OR circuit 01, which outputs the signal Q4'. For up counting, the count direction control signal MIR is kept at "0," and, for down counting, the count direction control signal MIR is kept at "'1." Thus, the OR circuit O1 outputs from its output terminal, as the signal Q4', the signal Q4 in up counting and the signal Q4X in down counting.

Figure 2:
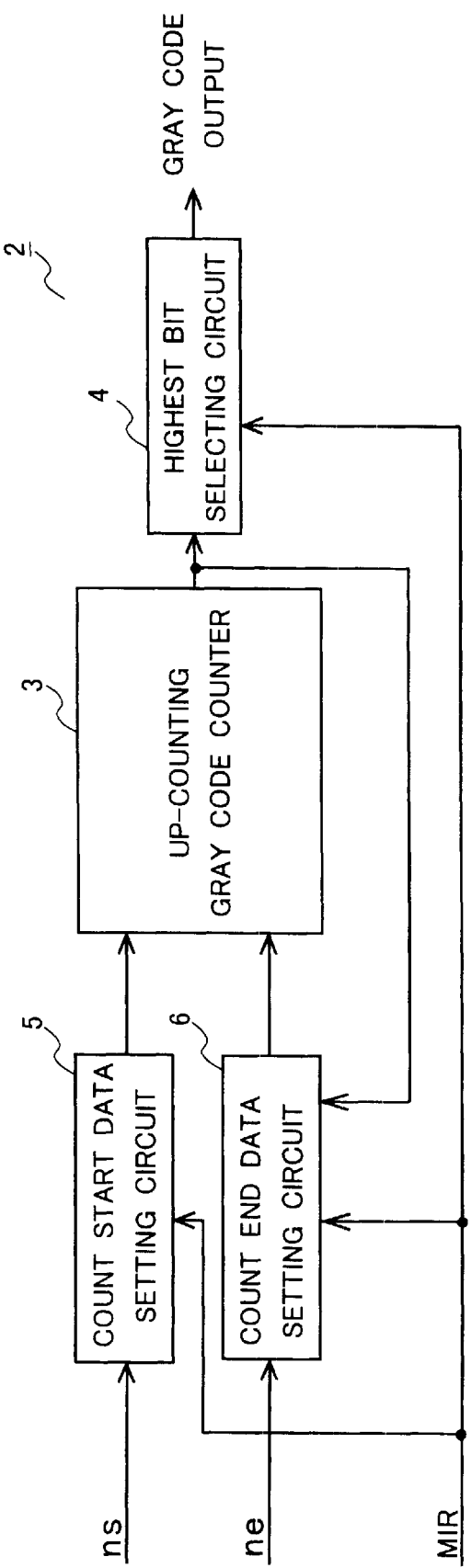
FIG. 2 is a configuration diagram of the up/down Gray code counter of a second embodiment of the invention.

Next, the up/down Gray code counter of a second embodiment of the invention will be described with reference to FIG. 2. In the up/down Gray code counter of the second embodiment shown in FIG. 2, such circuit blocks as are found also in the up/down Gray code counter shown in FIG. 1 are identified with the same reference numerals, and their explanations will not be repeated. It is assumed that, like the up/down Gray code counter of the first embodiment, the up/down Gray code counter of the second embodiment is of a five-bit type.

A count start data setting circuit 5 receives a value ns, represented in a Gray code, with which to start counting and the count direction control signal MIR. When the count direction control signal MIR is requesting up counting, the count start data setting circuit 5 feeds a control signal to the up-counting Gray code counter 3 to make the initial setting thereof equal to the Gray code value ns with which to start counting. By contrast, when the count direction control signal MIR is requesting down counting, the count start data setting circuit 5 feeds a control signal to the up-counting Gray code counter 3 to make the initial setting thereof equal to the Gray code value ns with which to start counting with only its highest bit inverted.

A count end data setting circuit 6 receives a value ne, represented in a Gray code, with which to end counting, the count, represented in a Gray code, output from the up-counting Gray code counter 3, and the count direction control signal MIR.

With the count direction control signal MIR requesting up counting, when the Gray code value ne with which to end counting becomes equal to the Gray code count output from the up-counting Gray code counter 3, the count end data setting circuit 6 controls the up-counting Gray code counter 3 to end counting.

By contrast, with the count direction control signal MIR requesting down counting, when the Gray code value ne with which to end counting with its highest bit inverted becomes equal to the Gray code count output from the up-counting Gray code counter 3, the count end data setting circuit 6 controls the up-counting Gray code counter 3 to end counting.

The up/down Gray code counter of the second embodiment is provided with the count start data setting circuit 5 and the count end data setting circuit 6, and therefore can start counting with the desired count and end counting with the desired count. This enhances the versatility of control that can be achieved on the basis of the count obtained from the up/down Gray code counter.

Next, an example of the configuration of the count start data setting circuit 5 and then of the count end data setting circuit 6 will be described.

Figure 8:
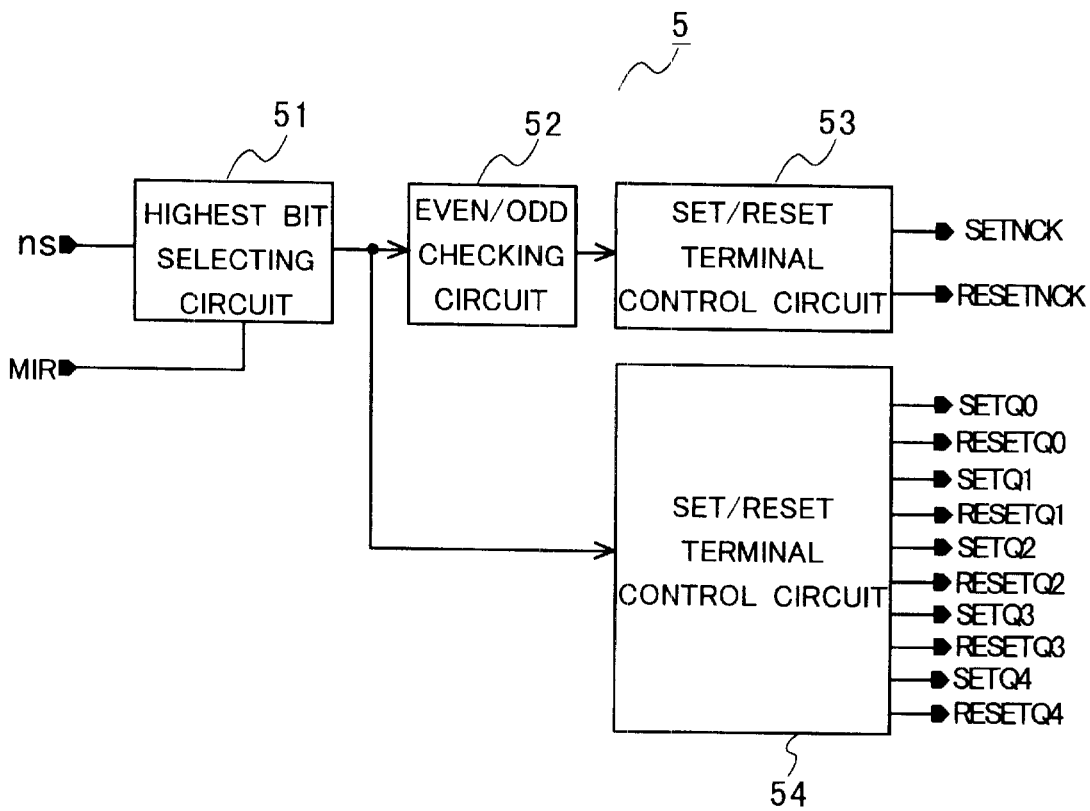
FIG. 8 is a configuration diagram of the count start data setting circuit provided in the up/down Gray code counter of FIG. 2.

A circuit block diagram showing an example of the configuration of the count start data setting circuit 5 is shown in FIG. 8. A highest bit selecting circuit 51 receives the Gray code count ns, which is in the form of five-bit data consisting of Q0DATA in the zeroth bit, i.e. the lowest bit, Q1DATA in the first bit, Q2DATA in the second bit, Q3DATA in the third bit, and Q4DATA in the fourth bit, i.e. the highest bit.

In up counting, the highest bit selecting circuit 51 uses Q4DATA intact as the highest bit Q4DATA' of the output signal. That is, the highest bit selecting circuit 51, to which the Gray code value ns with which to start counting is fed, feeds the value ns intact to an even/odd checking circuit 52 and to a set/reset terminal control circuit 54.

By contrast, in down counting, the highest bit selecting circuit 51 uses the inverted version of Q4DATA as the highest bit Q4DATA' of the output signal. That is, the highest bit selecting circuit 51, to which the Gray code value ns with which to start counting is fed, feeds the value ns, after inverting its highest bit, to the even/odd checking circuit 52 and to the set/reset terminal control circuit 54. This makes it possible for the up/down Gray code counter 2 to start counting with the correct count also in down counting.

Figure 12:
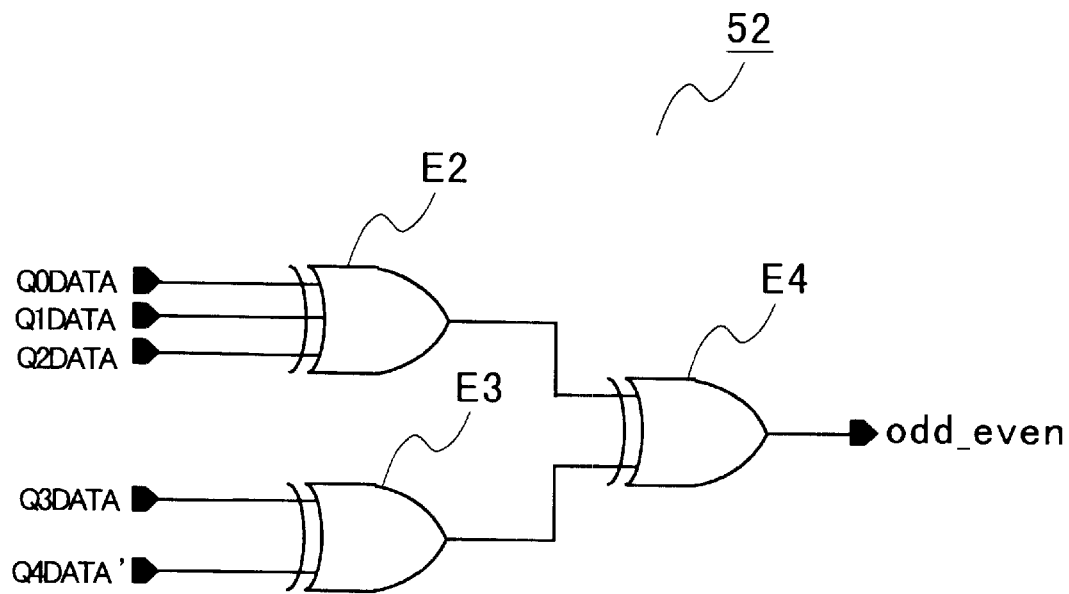
FIG. 12 is a diagram showing an example of the even/odd checking circuit shown in FIG. 8.

The even/odd checking circuit 52 outputs "0" when the count in decimal notation corresponding to the Gray code value fed thereto is an even number, and outputs "1" when the count in decimal notation corresponding to the Gray code value fed thereto is an odd number. When the count in decimal notation is an even number, the Gray code value corresponding thereto includes an even number of "1"s, and, when the count in decimal notation is an odd number, the Gray code value corresponding thereto includes an odd number of "1"s. Therefore, the even/odd checking circuit 52 is realized, for example, as a logic circuit as shown in FIG. 12.

The data Q0DATA in the lowest bit, the data Q1DATA in the first bit, and the data Q2DATA in the second bit output from the highest bit selecting circuit 51 are fed to an exclusive OR circuit E2. The data Q3DATA in the third bit and the data Q4DATA' in the highest bit output from the highest bit selecting circuit 51 are fed to an exclusive OR circuit E3. The output signals of the exclusive OR circuits E2 and E3 are fed to an exclusive OR circuit E4, which outputs an even/odd signal "odd_even."

On the basis of the even/odd signal "odd_even" output from the even/odd checking circuit 52, a set/reset terminal control circuit 53 produces control signals to be fed to the XS and XR terminals of the flip-flop FF6.

When the set/reset terminal control circuit 53 turns the set signal SETNCK it feeds to the XS terminal of the flip-flop FF6 to "1" and turns the reset signal RESETNCK it feeds to the XR terminal of the flip-flop FF6 to "0," the output signal that the flip-flop FF6 outputs from its Q terminal turns to "0." When the set/reset terminal control circuit 53 turns the set signal SETNCK it feeds to the XS terminal of the flip-flop FF6 to "0" and turns the reset signal RESETNCK it feeds to the XR terminal of the flip-flop FF6 to "1," the output signal that the flip-flop FF6 outputs via its Q terminal turns to "1." When the set/reset terminal control circuit 53 turns the set signal SETNCK it feeds to the XS terminal of the flip-flop FF6 to "1" and turns the reset signal RESETNCK it feeds to the XR terminal of the flip-flop FF6 to "1," the flip-flop FF6 operates normally.

An example of the configuration of the set/reset terminal control circuit 53, which operates as described above, is shown in FIG. 13. The even/odd signal "odd_even" is fed to the first input terminal of a NAND circuit NA30 and to an inverter circuit INV30, and the output signal of the inverter circuit INV30 is fed to the first input terminal of a NAND circuit NA31. Moreover, a start signal START is fed to the second input terminals of the NAND circuits NA30 and NA31. The NAND circuit NA30 outputs the set signal SETNCK, and the NAND circuit NA3 outputs the reset signal RESETNCK.

Figure 13:
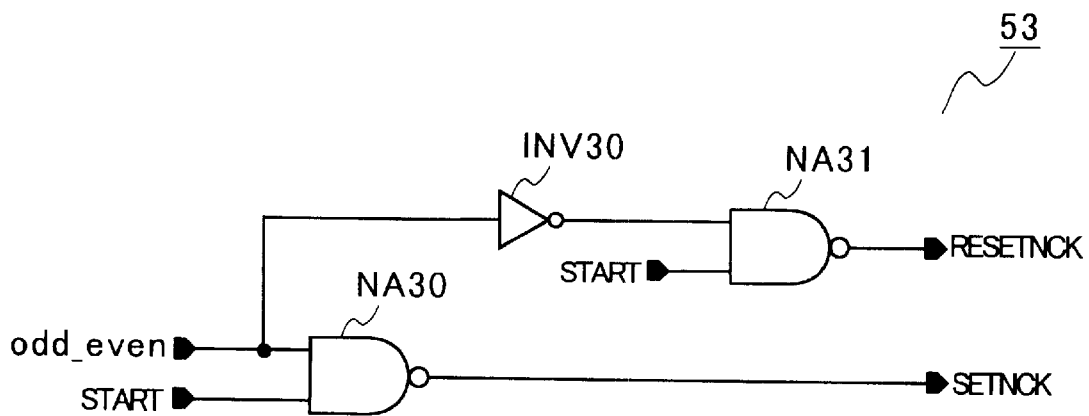
FIG. 13 is a diagram showing an example of the set/reset terminal control circuit that receives a signal from the even/odd checking circuit shown in FIG. 8.

When the set/reset terminal control circuit 53 is configured as shown in FIG. 13, the flip-flop FF6 can be made to operate normally by turning the start signal START to "0" and turning the set signal SETNCK and the reset signal RESETNCK to "1."

Figure 5:
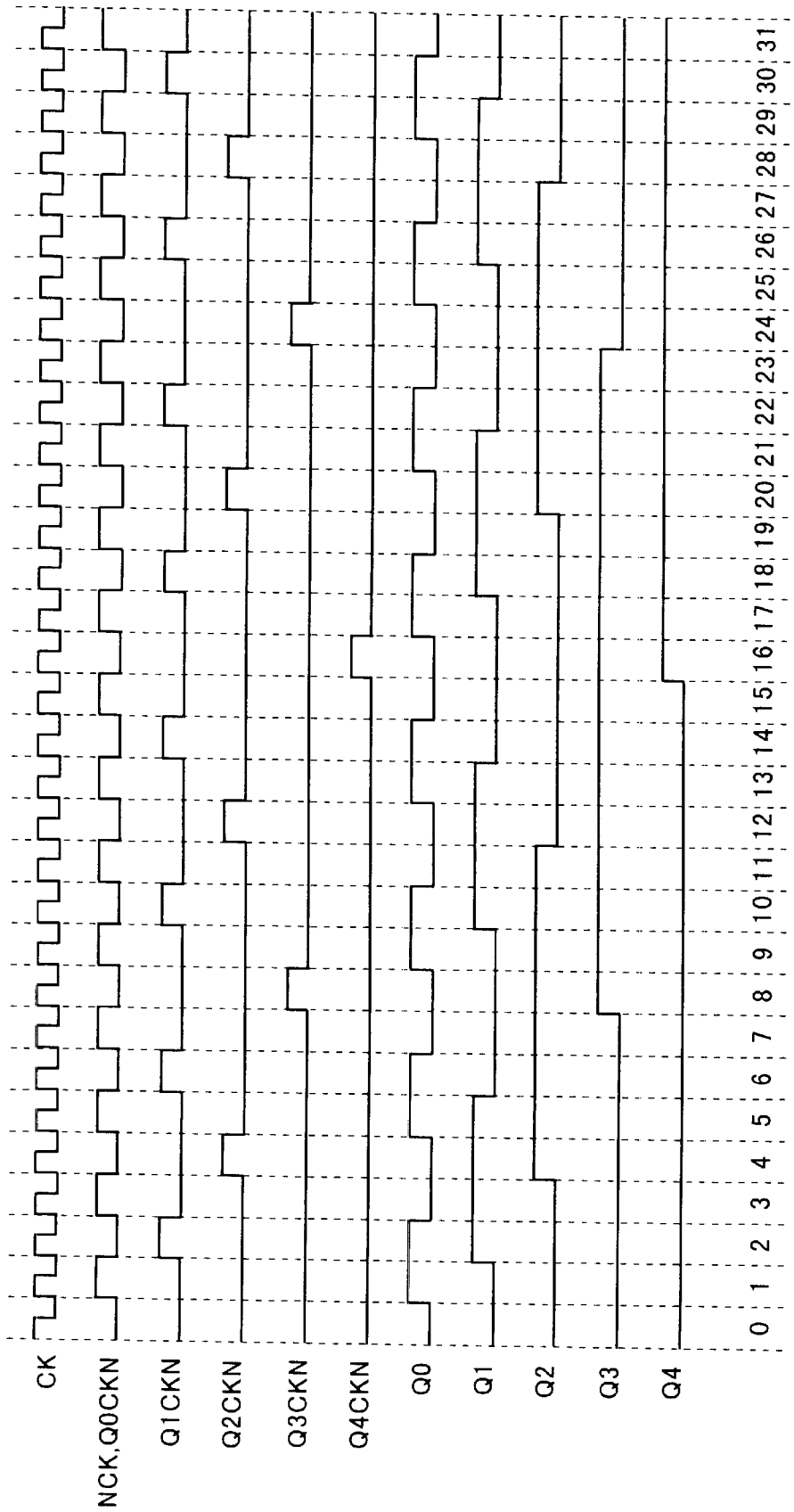
FIG. 5 is a time chart showing the up counting operation of the up/down Gray code counter of FIG. 1.

To start counting, the start signal START is turned to "1." In this case, when the even/odd signal "odd_even" is at "1" (i.e. when the count in decimal notation of the value ns at which to start counting is an odd number), the set signal SETNCK turns to "0" and the reset signal RESETNCK turns to "1." When the even/odd signal "odd_even" is at "0" (i.e. when the count in decimal notation of the value ns at which to start counting is an even number), the set signal SETNCK turns to "1" and the reset signal RESETNCK turns to "0." In this way, as FIG. 5 shows, it is possible, when the count in decimal notation of the value ns at which to start counting is an odd number, to turn the ½ clock signal NCK that the flip-flop FF6 outputs from its Q output terminal to "1" and, when the count in decimal notation of the value ns at which to start counting is an even number, to turn the ½ clock signal NCK that the flip-flop FF6 outputs from its Q output terminal to "0."

On the basis of the five-bit data Q0DATA, Q1DATA, Q2DATA, Q3DATA, and Q4DATA' output from the highest bit selecting circuit 51, the set/reset terminal control circuit 54 produces control signals to be fed to the XS and XR terminals of the flip-flops FF1 to FF5.

Figure 9:
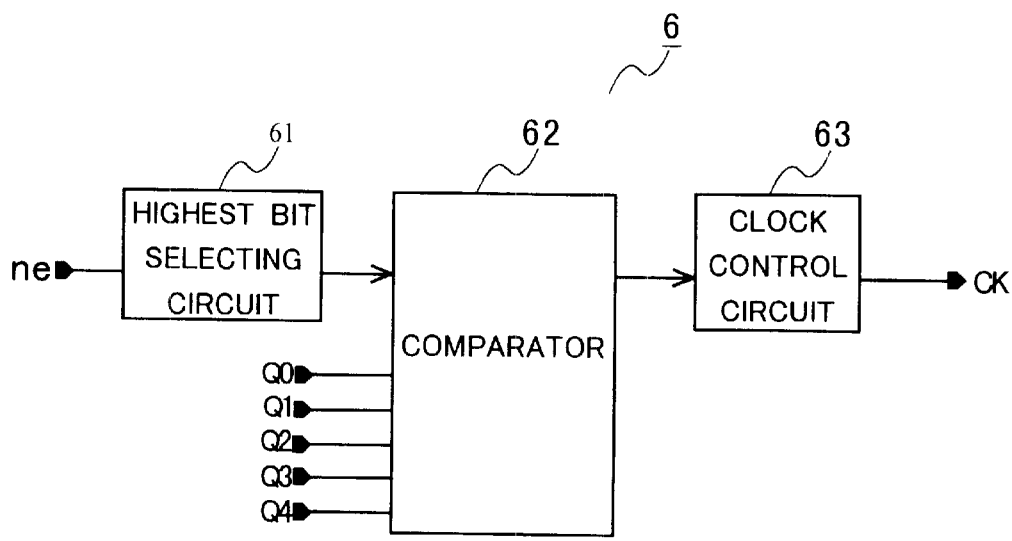
FIG. 9 is a configuration diagram of the count end data setting circuit provided in the up/down Gray code counter of FIG. 2.
Figure 14:
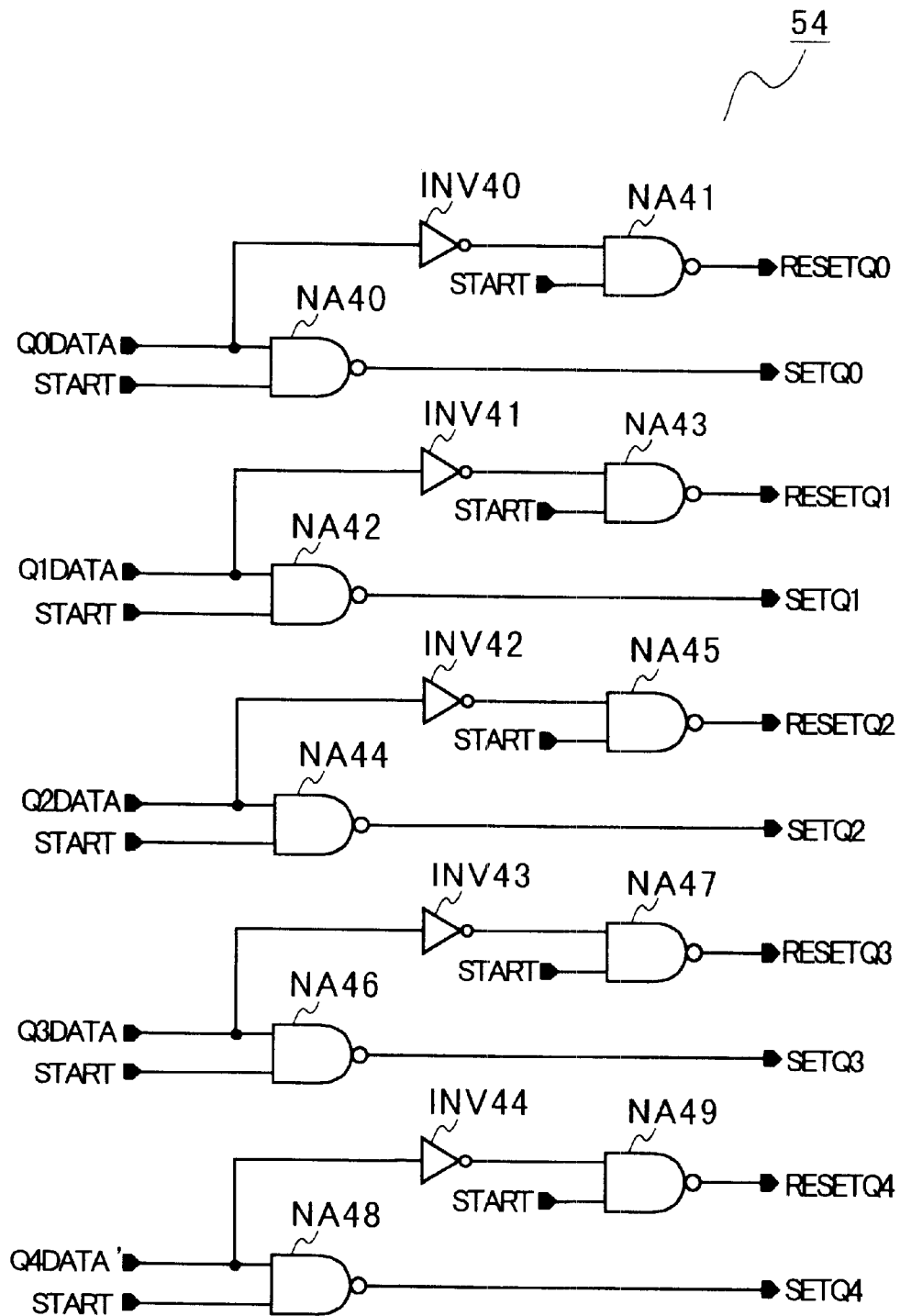
FIG. 14 is a diagram showing another example of the set/reset terminal control circuit shown in FIG. 8.

An example of the configuration of the set/reset terminal control circuit 54 is shown in FIG. 14, The set/reset terminal control circuit 54 is provided with five circuits each having the same configuration as the set/reset terminal control circuit 53. These five circuits receive, instead of the even/odd signal "odd_even," Q0DATA, Q1DATA, Q2DATA, Q3DATA, and Q4DATA', respectively. Thus, when the start signal START is turned to "1," the up/down Gray code counter 2 outputs the Gray code value ns with which to start counting; when the start signal START is turned to "0," the flip-flops FF1 to FF5 operate normally, and therefore the up/down Gray code counter 2 performs counting:

A circuit block diagram showing an example of the configuration of the count end data setting circuit 6 is shown in FIG. 9. A highest bit selecting circuit 61 receives the Gray code count ne, which is in the form of five-bit data consisting of Q0eDATA in the zeroth bit, i.e. the lowest bit, Q1eDATA in the first bit, Q2eDATA in the second bit, Q3eDATA in the third bit, and Q4eDATA in the fourth bit, i.e. the highest bit.

In up counting, the highest bit selecting circuit 61 uses Q4eDATA as the highest bit Q4eDATA' of the output signal. That is, the highest bit selecting circuit 61, to which the Gray code value ne with which to end counting is fed, outputs the value ne intact to a comparator 62. By contrast, in down counting, the highest bit selecting circuit 61 uses the inverted version of Q4eDATA as the highest bit Q4eDATA' of the output signal. That is, the highest bit selecting circuit 61, to which the Gray code value ne with which to end counting is fed, outputs the value ne, after inverting its highest bit, to a comparator 62

The comparator 62 compares the data Q0eDATA, Q1eDATA, Q2eDATA, Q3eDATA, and Qe4DATA' fed thereto from the highest bit selecting circuit 61 with the output signals Q0, Q1, Q2, Q3, and Q4 of the up/down Gray code counter, and, if these two sets of data coincide in all of the lowest, first, second, third, and highest bits, feeds a control signal to a clock control circuit 63 to instruct it to stop outputting the clock signal CK. As a result, the supply of the clock signal CK to the up-counting Gray code counter 3 is stopped, and thus the up-counting Gray code counter 3 stops counting.

Alternatively, the count end data setting circuit 6 may be so configured as to compare the value ne with which to stop counting with the output of the highest bit selecting circuit 4 and, if they coincide, feed a control signal to the clock control circuit 63 to instruct it to stop outputting the clock signal CK. This configuration eliminates the need to provide a highest bit selecting circuit in the count end data setting circuit 6, and thus helps reduce the number of components.

The embodiment described above deals with a five-bit up/down Gray code counter. However, needless to say, the present invention is applicable also to N-bit up/down Gray code counters where N<5 or N>5. It is also possible to use a down-counting Gray code counter and make it count up by inverting the highest bit.

Figure 15:
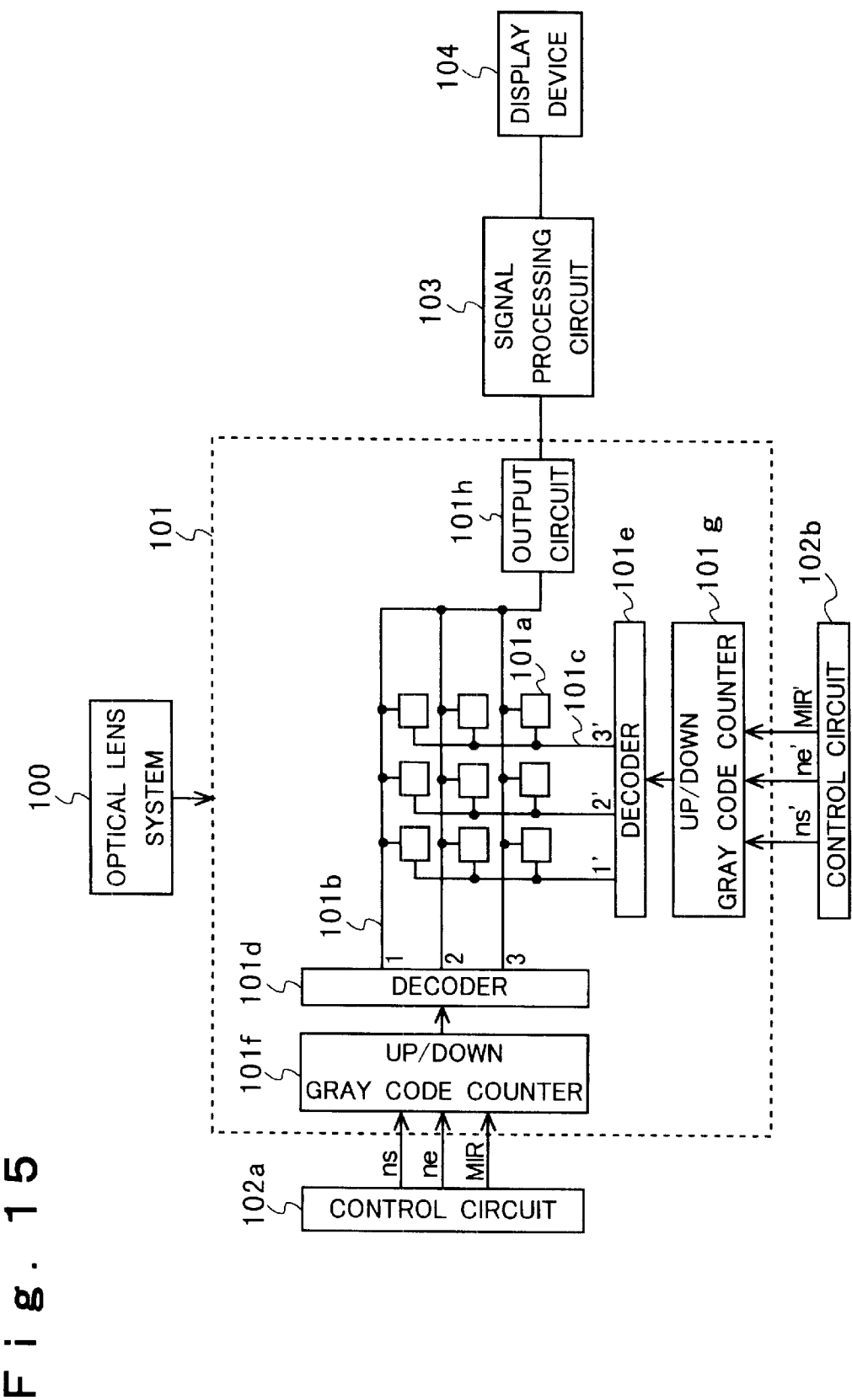
FIG. 15 is a diagram showing the configuration of a solid-state image sensor embodying the invention.

Next, a solid-state image sensor embodying the invention will be described with reference to FIG. 15. An optical lens system 100 picks up an optical real image (not shown) as a target of image sensing, and images it on a solid-state image sensor 101.

The solid-state image sensor 101 has photoelectric conversion elements 101a arranged in a matrix. One of vertical-direction selection lines 101b is selected by a vertical-direction decoder 101d, and one of horizontal-direction selection lines 101c is selected by a horizontal-direction decoder 101e.

The vertical-direction decoder 101d selects the address specified by a vertical-direction up/down Gray code counter 101f, and the horizontal-direction decoder 101e selects the address specified by a horizontal-direction up/down Gray code counter 101g. The signal at the address specified by both the selected vertical-selection line 101b and the selected horizontal-selection line 101c is fed out by an output circuit 11h.

With the vertical-direction up/down Gray code counter 101f fixed, and thus with the address in the vertical direction fixed, the horizontal-direction up/down Gray code counter 101g is made to count to perform scanning in the horizontal direction along one horizontal line. On completion of the scanning along this horizontal line, the vertical-direction up/down Gray code counter 101f is made to count so that scanning is then performed along the next horizontal line. This is repeated so as to achieve image sensing. Here, the vertical-direction up/down Gray code counter 101f and the horizontal-direction up/down Gray code counter 101g have the same configuration as the up/down Gray code counter 2 shown in FIG. 2. This makes it possible to reduce the circuit scale of the vertical-direction up/down Gray code counter 101f and the horizontal-direction up/down Gray code counter 101g. This in turn makes it possible to miniaturize the solid-state image sensor.

A vertical-direction control circuit 102a feeds a count start value ns, a count end value ne, and a count direction control signal MIR to the vertical-direction up/down Gray code counter 101f, and a horizontal-direction control circuit 102b feeds a count start value ns', a count end value ne', and a count direction control signal MIR' to the horizontal-direction up/down Gray code counter 101g.

When both the vertical-direction up/down Gray code counter 101f and the horizontal-direction up/down Gray code counter 101g count up, scanning is performed from the left-hand upper corner to the right-hand lower corner of the screen. When vertical-direction up/down Gray code counter 101f counts up and the horizontal-direction up/down Gray code counter 101g counts down, scanning is performed from the right-hand upper corner to the left-hand lower corner of the screen. When vertical-direction up/down Gray code counter 101f counts down and the horizontal-direction up/down Gray code counter 101g counts up, scanning is performed from the left-hand lower corner to the right-hand upper corner of the screen. When both the vertical-direction up/down Gray code counter 101f and the horizontal-direction up/down Gray code counter 101g count down, scanning is performed from the right-hand lower corner to the left-hand upper corner of the screen.

That is, by switching the count direction control signals MIR and MIR' fed to the vertical-direction up/down Gray code counter 101f and the horizontal-direction up/down Gray code counter 101g, it is possible to switch between a normal image mode and a mirror image mode in each of the vertical and horizontal directions.

The output circuit 101h outputs a signal voltage to a signal processing circuit 103 in the following stage. On the basis of the signal voltage output from the output circuit 101h, the signal processing circuit 103 produces a drive signal and feeds it to a display device 104.

What is claimed is:

1. An up/down Gray code counter comprising:
    a one-way Gray code counter that can count only in one, up or down, direction; and
    a highest bit selecting circuit,
    wherein the highest bit selecting circuit receives a highest bit of data output from the one-way Gray code counter and then outputs, as a highest-bit output of the up/down Gray code counter, the bit selectively either intact or after inverting the bit.

2. An up/down Gray code counter as claimed in claim 1, further comprising:
    a count start data setting circuit, a wherein the count start data setting circuit controls an initial state of the one-way Gray code counter according to Gray code data corresponding to a count in decimal notation at which counting is started.

3. An up/down Gray code counter as claimed in claim 2, wherein, when the up/down Gray code counter counts in an opposite direction to the direction in which the one-way Gray code counter counts,
    the count start data setting circuit inverts only a highest bit of the Gray code data corresponding to the count in decimal notation at which counting is started, and
    the one-way Gray code counter starts counting with the Gray code data having the highest bit thereof inverted.

4. An up/down Gray code counter as claimed in claim 1, further comprising:
    a count end data setting circuit,
    wherein the count end data setting circuit makes the one-way Gray code counter stop counting according to Gray code data corresponding to a count in decimal notation at which counting is ended.

5. An up/down Gray code counter as claimed in claim 1, wherein the highest bit selecting circuit outputs, as a highest-bit output of the up/down Gray code counter, the highest bit of the data intact when the up/down Gray code counter counts in an identical direction with the direction in which the one-way Gray code counter counts, and
    the highest bit selecting circuit outputs, as a highest bit output of the up/down Gray code counter, the highest bit of the data after inverting the bit when the up/down Gray code counter counts in an opposite direction to the direction in which the one-way Gray code counter counts.

6. An up/down Gray code counter as claimed in claim 5, further comprising:
    a count start data setting circuit,
    wherein the count start data setting circuit controls an initial state of the one-way Gray code counter according to Gray code data corresponding to a count in decimal notation at which counting is started.

7. An up/down Gray code counter as claimed in claim 6, wherein, when the up/down Gray code counter counts in an opposite direction to the direction in which the one-way Gray code counter counts,
    the count start data setting circuit inverts only a highest bit of the Gray code data corresponding to the count in decimal notation at which counting is started, and
    the one-way Gray code counter starts counting with the Gray code data having the highest bit thereof inverted.

8. An up/down Gray code counter as claimed in claim 5, further comprising:
    a count end data setting circuit,
    wherein the count end data setting circuit makes the one-way Gray code counter stop counting according to Gray code data corresponding to a count in decimal notation at which counting is ended.

9. A solid-state image sensor comprising:
    a plurality of photoelectric conversion elements; and a scanning circuit including an up/down Gray code counter for sequentially reading signals from the photoelectric conversion elements, wherein the up/down Gray code counter comprises a one-way Gray code counter that can count only in one, up or down, direction and a highest bit selecting circuit that receives a highest bit of data output from the one-way Gray code counter and that then outputs the bit selectively either intact or after inverting the bit.

10. A solid-state image sensor as claimed in claim 9, wherein the up/down Gray code counter further comprises a count start data setting circuit, and the count start data setting circuit controls an initial state of the one-way Gray code counter according to Gray code data corresponding to a count in decimal notation at which counting is started.

11. A solid-state image sensor as claimed in claim 10, wherein, when the up/down Gray code counter counts in an opposite direction to the direction in which the one-way Gray code counter counts, the count start data setting circuit inverts only a highest bit of the Gray code data corresponding to the count in decimal notation at which counting is started, and the one-way Gray code counter starts counting with the Gray code data having the highest bit thereof inverted.

12. A solid-state image sensor as claimed in claim 9, wherein the up/down Gray code counter further comprises a count end data setting circuit, and the count end data setting circuit makes the one-way Gray code counter stop counting according to Gray code data corresponding to a count in decimal notation at which counting is ended.

13. A solid-state image sensor as claimed in claim 9, wherein the highest bit selecting circuit outputs the highest bit of the data intact when the up/down Gray code counter counts in an identical direction with the direction in which the one-way Gray code counter counts, and the highest bit selecting circuit outputs the highest bit of the data after inverting the bit when the up/down Gray code counter counts in an opposite direction to the direction in which the one-way Gray code counter counts.

14. A solid-state image sensor as claimed in claim 13, wherein the up/down Gray code counter further comprises a count start data setting circuit, and the count start data setting circuit controls an initial state of the one-way Gray code counter according to Gray code data corresponding to a count in decimal notation at which counting is started.

15. A solid-state image sensor as claimed in claim 14, wherein, when the up/down Gray code counter counts in an opposite direction to the direction in which the one-way Gray code counter counts, the count start data setting circuit inverts only a highest bit of the Gray code data corresponding to the count in decimal notation at which counting is started, and the one-way Gray code counter starts counting with the Gray code data having the highest bit thereof inverted.

16. A solid-state image sensor as claimed in claim 13, wherein the up/down Gray code counter further comprises a count end data setting circuit, and the count end data setting circuit makes the one-way Gray code counter stop counting according to Gray code data corresponding to a count in decimal notation at which counting is ended.

* * * * *